US012198766B2

(12) United States Patent
Lin et al.

(10) Patent No.: US 12,198,766 B2
(45) Date of Patent: Jan. 14, 2025

(54) ARTIFICIAL NEURAL NETWORK OPERATION CIRCUIT AND IN-MEMORY COMPUTATION DEVICE THEREOF

(71) Applicant: MACRONIX International Co., Ltd., Hsinchu (TW)

(72) Inventors: Yu-Hsuan Lin, Taichung (TW); Yu-Yu Lin, New Taipei (TW); Hsiang-Lan Lung, Kaohsiung (TW)

(73) Assignee: Macronix International Co., Ltd., Hsinchu (TW)

(*) Notice: Subject to any disclaimer, the term of this patent is extended or adjusted under 35 U.S.C. 154(b) by 212 days.

(21) Appl. No.: 18/172,306

(22) Filed: Feb. 22, 2023

(65) Prior Publication Data

US 2024/0282382 A1    Aug. 22, 2024

(51) Int. Cl.
*G11C 16/12* (2006.01)
*G11C 16/08* (2006.01)
*G11C 16/24* (2006.01)

(52) U.S. Cl.
CPC .............. *G11C 16/12* (2013.01); *G11C 16/08* (2013.01); *G11C 16/24* (2013.01)

(58) Field of Classification Search
CPC ......... G11C 16/12; G11C 16/08; G11C 16/24; G11C 11/54; G11C 13/0004; G11C 13/004; G06N 3/063; G06F 9/30007
USPC .................................................. 365/185.18
See application file for complete search history.

(56) References Cited

U.S. PATENT DOCUMENTS

| | | | |
|---|---|---|---|
| 2020/0192970 A1 | 6/2020 | Ma et al. | |
| 2023/0102492 A1* | 3/2023 | Rawat | G06N 3/063 |
| | | | 365/189.05 |
| 2023/0238055 A1* | 7/2023 | Pasotti | G11C 13/0026 |
| | | | 365/230.03 |

FOREIGN PATENT DOCUMENTS

| | | |
|---|---|---|
| CN | 109800876 | 5/2019 |
| CN | 112529171 | 3/2021 |
| TW | 202308128 | 2/2023 |

OTHER PUBLICATIONS

"Office Action of Taiwan Counterpart Application", issued on Jul. 29, 2024, pp. 1-6.

(Continued)

*Primary Examiner* — Huan Hoang
(74) *Attorney, Agent, or Firm* — J.C. PATENTS

(57) ABSTRACT

An artificial neural network operation circuit and an in-memory computation device of the artificial neural network operation circuit are proposed. The in-memory computation device includes a memory cell array, a compensation memory cell string, and an operator. The memory cell array has a plurality of memory cells to store a plurality of weight values. The memory cell array has a plurality of word lines and a plurality of bit lines. Each compensation memory cell of the compensation memory cell string stores a unit weight value. The operator multiplies a signal on a compensation bit line by peak weight information of the weight values to generate a first signal and adds the first signal to each signal on the bit lines to obtain a plurality of computation results, respectively.

20 Claims, 8 Drawing Sheets

(56) References Cited

OTHER PUBLICATIONS

G.W. Burr et al., "Experimental demonstration and tolerancing of a large-scale neural network (165,000 synapses), using phase-change memory as the synaptic weight element," 2014 IEEE International Electron Devices Meeting, Dec. 2014, pp. 1-4.

I. Boybat et al., "Temperature sensitivity of analog in-memory computing using phase-change memory," 2021 IEEE International Electron Devices Meeting (IEDM), Dec. 2021, pp. 1-4.

* cited by examiner

ARTIFICIAL NEURAL NETWORK OPERATION CIRCUIT AND IN-MEMORY COMPUTATION DEVICE THEREOF

BACKGROUND

Technical Field

The disclosure relates to an artificial neural network operation circuit and an in-memory computation device thereof; more particularly, the disclosure relates to an artificial neural network operation circuit operated when memory cells are in a stable state and an in-memory computation device of the artificial neural network operation circuit.

Description of Related Art

With the advancement of artificial intelligence (AI) technologies, providing an in-memory computation device with good computation capabilities of performing a multiply-accumulate (MAC) computation has become an important trend. In an artificial neural network system, weight values in some computational layers may be distributed in a manner where a peak weight value is equal to 0, and weight values in the other computational layers may be distributed in a manner where a peak weight value is not equal to 0.

To effectively and stably store the weight values distributed in different manner and take into account the accuracy of in-memory computation operations, how to set an in-memory computation device with satisfactory performance has become a crucial topic for engineers.

SUMMARY

The disclosure relates to an artificial neural network operation circuit and an in-memory computation device thereof, which are capable of enhancing the accuracy of MAC computations.

An embodiment of the disclosure provides an in-memory computation device which includes a memory cell array, a compensation memory cell string, and an operator. The memory cell array has a plurality of memory cells to store a plurality of weight values and has a plurality of word lines and a plurality of bit lines. The compensation memory cell string has a plurality of compensation memory cells coupled to a compensation bit line, where the compensation memory cells are coupled to the word lines, respectively, and each of the compensation memory cells stores a unit weight value. The operator is coupled to the bit lines and the compensation bit line, multiplies a signal on the compensation bit line by peak weight information of the weight values to generate a first signal, and adds the first signal to a signal on each of the bit lines to obtain a plurality of computation results, respectively.

An embodiment of the disclosure provides an artificial neural network operation circuit which includes a plurality of the in-memory computation devices described above.

In view of the foregoing, in the in-memory computation device provided in one or more embodiments of the disclosure, when the weight values are written into the memory cells, the peak weight value of the memory cells is set to be in a stable state at a value 0. During computations, the in-memory computation device may multiply the signal provided by the compensation memory cell string by the peak weight information of the weight values through the operator and compensate the in-memory computation operations. As such, the in-memory computation device provided in one or more embodiments of the disclosure may simultaneously enable the memory cells to stably operate in a reset state without affecting the correctness of the MAC computation, thus effectively improving the accuracy of the computation results.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
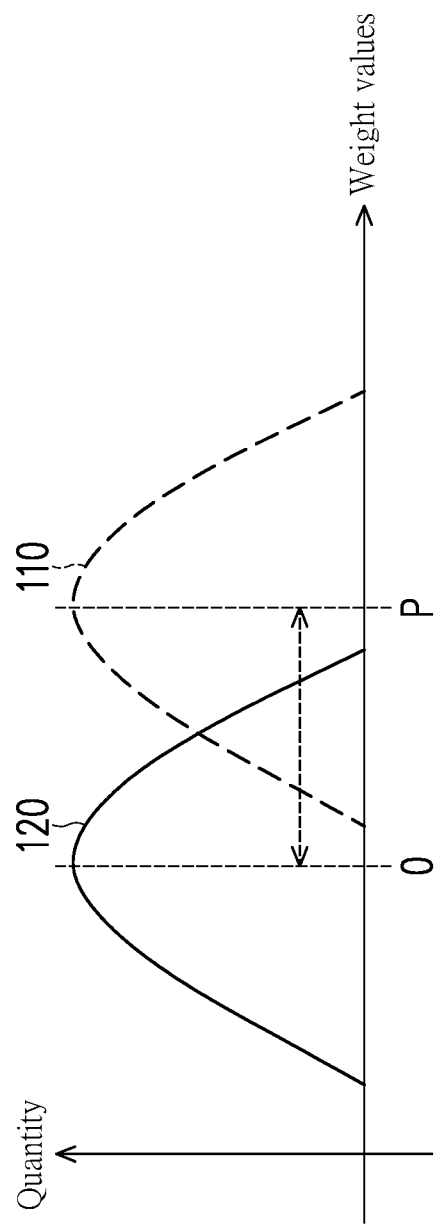
FIG. 1 is a schematic view illustrating a distribution of weight values in an in-memory computation device according to an embodiment of the disclosure.

With reference to FIG. 1, FIG. 1 is a schematic view illustrating a distribution of weight values in an in-memory computation device according to an embodiment of the disclosure. According to an embodiment of the disclosure, in the in-memory computation device, a plurality of memory cells of a memory cell array may store a plurality of weight values. The distribution of the weight values and the quantity of the corresponding memory cells may be shown in a distribution curve 110, where the peak weight value corresponding to the maximum quantity of the memory cells may be equal to P.

When the weight values are written into the memory cells of an exemplary phase change memory cell array as the in-memory computation device, the memory cells may be selected to be written when the memory cells are in a reset state and thereby provide a differential weight value. This is because a conductance value (or a resistance value) of the memory cells in the reset state in the phase change memory is more stable than a conductance value (or a resistance value) of the memory cells in a set state. Besides, one memory cell of each pair of memory cells in the reset state is operated in a high-resistance state, and the other corresponding memory cell of each pair of memory cells in the reset state is operated in a low-resistance state. Moreover, according to this embodiment, in a distribution curve 120 of the weight values and the quantity of corresponding memory cells in the memory cell array, the peak weight value falls on a location where the weight value is equal to 0.

When the in-memory computation operation is performed, the in-memory computation device provided in one or more embodiments of the disclosure may compensate the error between the peak weight values 0 and P between the distribution curves 110 and 120, so as to ensure the accuracy of the generated computation results.

Figure 2:
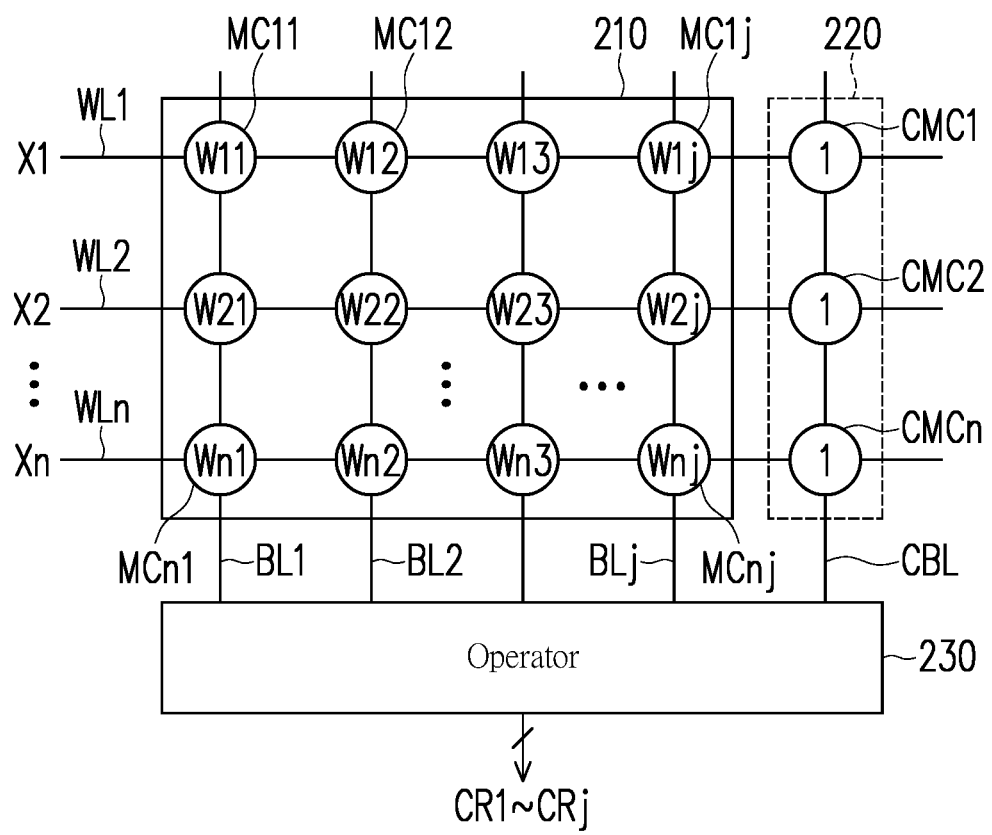
FIG. 2 is a schematic view illustrating an in-memory computation device according to an embodiment of the disclosure.

With reference to FIG. 2, FIG. 2 is a schematic view illustrating an in-memory computation device according to an embodiment of the disclosure. An in-memory computation device 200 includes a memory cell array 210, a compensation memory cell string 220, and an operator 230. The memory cell array 210 has a plurality of memory cells MC11-MCnj, and the memory cell array 210 has a plurality of word lines WL1-WLn and a plurality of bit lines BL1-BLj. Each of the memory cells MC11-MCnj is coupled between the corresponding word line of the word lines WL1-WLn and the corresponding bit line of the bit lines BL1-BLj. The memory cells MC11-MCnj are configured to respectively store a plurality of weight values W11-Wnj, where the weight values W11-Wnj may be the conductance values or the resistance values of the memory cells MC11-MCnj. Signals provided by the bit lines BL1-BLj and a compensation bit line CBL may be current signals or voltage signals. In this embodiment, the weight values W11-Wnj may have peak weight information equal to P, and the peak weight information is the peak weight value corresponding to the maximum quantity of the memory cells.

The memory cell array 210 may respectively receive a plurality of input signals X1-Xn through the word lines WL1-WLn. The memory cells MC11-MCnj may multiply the received input signals X1-Xn by the stored weight values W11-Wnj and add the multiplication computation results of the memory cells MC11-MCnj on the same bit lines BL1-BLj, so as to generate a plurality of MAC computation results on the bit lines BL1-BLj, respectively.

On the other hand, the compensation memory cell string 220 has a plurality of compensation memory cells CMC1-CMCn coupled to the compensation bit line CBL. In this embodiment, the quantity of the compensation memory cells CMC1-CMCn is the same as the quantity of the word lines WL1-WLn, and the compensation memory cells CMC1-CMCn are coupled to the word lines WL1-WLn, respectively. The compensation memory cells CMC1-CMCn store the same unit weight value (e.g., equal to 1). The compensation memory cells CMC1-CMCn respectively multiply the input signals X1-Xn by the unit weight value to generate a plurality of multiplication computation results and add the multiplication computation results on the compensation bit line CBL to generate another MAC computation result.

The operator 230 is coupled to the bit lines BL1-BLj and the compensation bit line CBL. The operator 230 multiplies the MAC computation result on the compensation bit line CBL by the weight information (e.g., equal to P) to obtain a first signal. In addition, the operator 230 may respectively add a plurality of MAC computation results on the bit lines BL1-BLj to the first signal to generate a plurality of computation results CR1-CRj.

In the correct state and on the exemplary bit line BL1, note that the computation result CR1 to be generated by the in-memory computation device 200 should be equal to $$a1 = \sum_{i=1}^{n} Xi \times W_{i1}.$$

However, in order to ensure the stability of the memory cells MC11-MCn1, the peak weight value in the distribution range of the weight values W11-Wn1 of the memory cells MC11-MCn1 is set as 0. Hence, the computation result which may be calculated by the memory cell array 210 is equal to $$a1' = \sum_{i=1}^{n} Xi \times (W_{i1} - P) = \sum_{i=1}^{n} XiW_{i1} - P\sum_{i=1}^{n} Xi, \text{ and } a1' + P\sum_{i=1}^{n} Xi = a1$$

may be deduced therefrom.

It may be learned from the above mathematical formula that the compensation memory cell string 220 provided in one or more embodiments of the disclosure may compensate a computation result a1' calculated by the memory cell array 210 and obtain the correct computation result CR1 by multiplying the input signals X1-Xn by the unit weight value, adding the multiplication computation results (equal to $$\sum_{i=1}^{n} Xi$$

), and multiplying by the operator 230 the multiplication computation results generated by the compensation memory cell string 220 by P times (equal to $$P\sum_{i=1}^{n} Xi$$

) to generate the first signal.

Accordingly, the in-memory computation device 200 may effectively compensate the MAC computation results on the bit lines BL1-BLj and generate the correct computation results CR1-CRj through adding the MAC computation results on the bit lines BL1-BLj to the first signal, respectively.

Besides, in addition to phase change memory (PCM) cells, the memory cells MC11-MCnj provided in one or more embodiments of the disclosure may also be resistive memory cells, ferroelectric memory cells, ferroelectric field effect transistor (FeFET) memory cells, magnetoresistive memory cells, or flash memory cells of any type.

Figure 3:
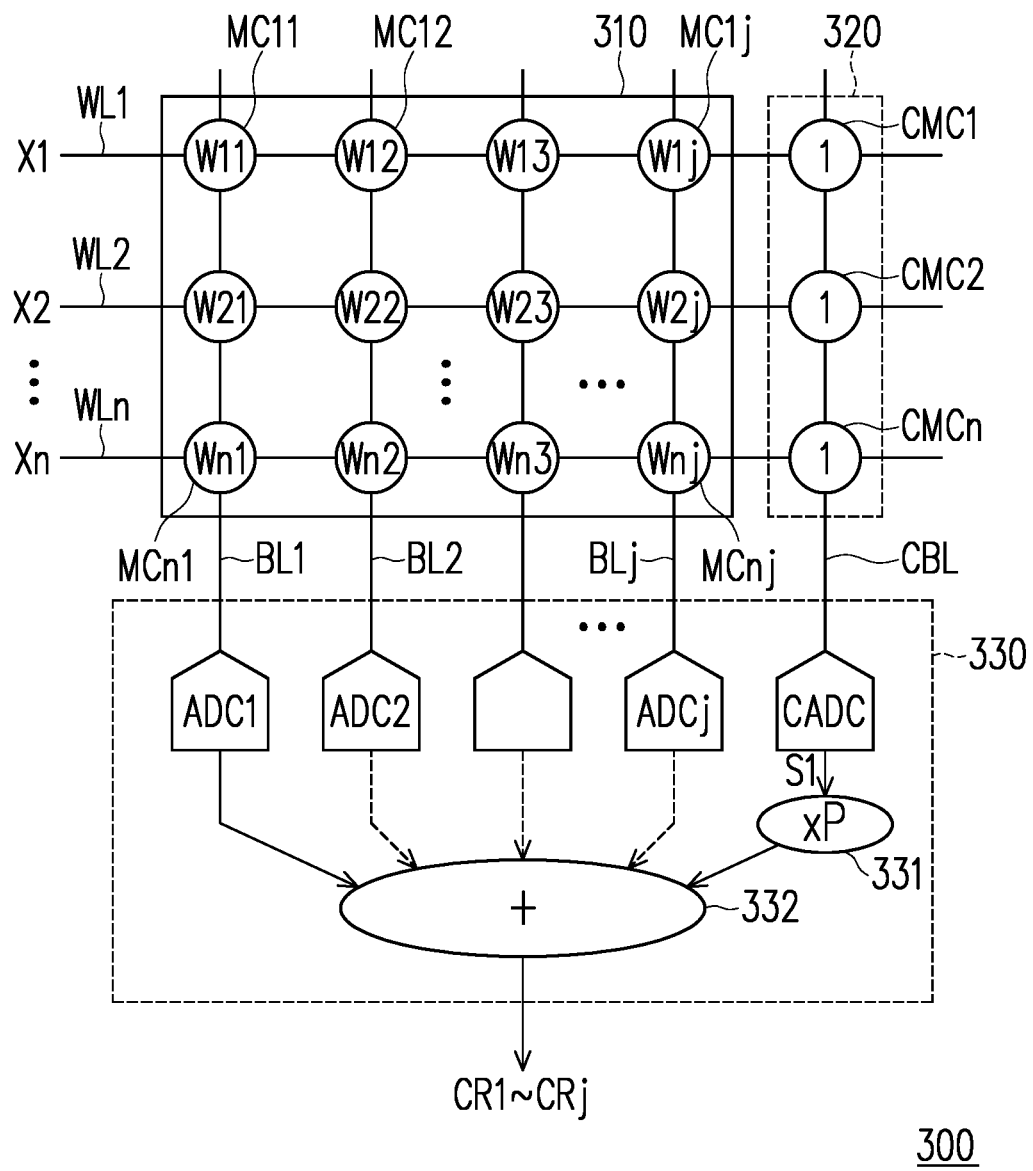
FIG. 3 to FIG. 5 are schematic views illustrating in-memory computation devices according to several embodiments of the disclosure.

With reference to FIG. 3, FIG. 3 is a schematic view illustrating an in-memory computation device according to another embodiment of the disclosure. An in-memory computation device 300 includes a memory cell array 310, a compensation memory cell string 320, and an operator 330. The memory cell array 310 includes a plurality of memory cells MC11-MCnj. Each of the memory cells MC11-MCnj is coupled between the corresponding word line of the word lines WL1-WLn and the corresponding bit line of the bit lines BL1-BLj. The memory cells MC11-MCnj may respectively receive a plurality of input signals X1-Xn through the word lines WL1-WLn. The compensation memory cell string 320 includes a plurality of compensation memory cells CMC1-CMCn. The compensation memory cells CMC1-CMCn are respectively coupled to the word lines WL1-WLn.

In this embodiment, the operator 330 includes a plurality of analog to digital converters ADC1-ADCj and CADC, a multiplier 331, and an adder 332. The analog to digital converters ADC1-ADCj are coupled to the bit lines BL1-BLj, respectively, and the analog to digital converter CADC is coupled to the compensation bit line CBL. The analog to digital converters ADC1-ADCj are configured to convert signals on the bit lines BL1-BLj to a digital format, respectively, and the analog to digital converter CADC is configured to convert a signal on the compensation bit line CBL to a digital format. The multiplier 331 is coupled to the analog to digital converter CADC and performs a multiplication on the signal on the compensation bit line CBL. In this embodiment, the multiplier 331 may multiply the signal on the compensation bit line CBL by P to generate the first signal S1, where P is the peak weight information of the weight values W11-Wnj. The adder 332 is coupled to output ends of the analog to digital converters ADC1-ADCj and an output end of the multiplier 331. The adder 332 may add the signal on each of the bit lines BL1-BLj to the output (the first signal S1) of the multiplier 331, so as to generate respective computation results CR1-CRj.

The multiplier 331 and the adder 332 provided in this embodiment may be implemented by applying a digital signal multiplication circuit and a digital signal addition circuit well-known to people having ordinary skill in the pertinent field, which should not be construed as a limitation in the disclosure.

Figure 4:
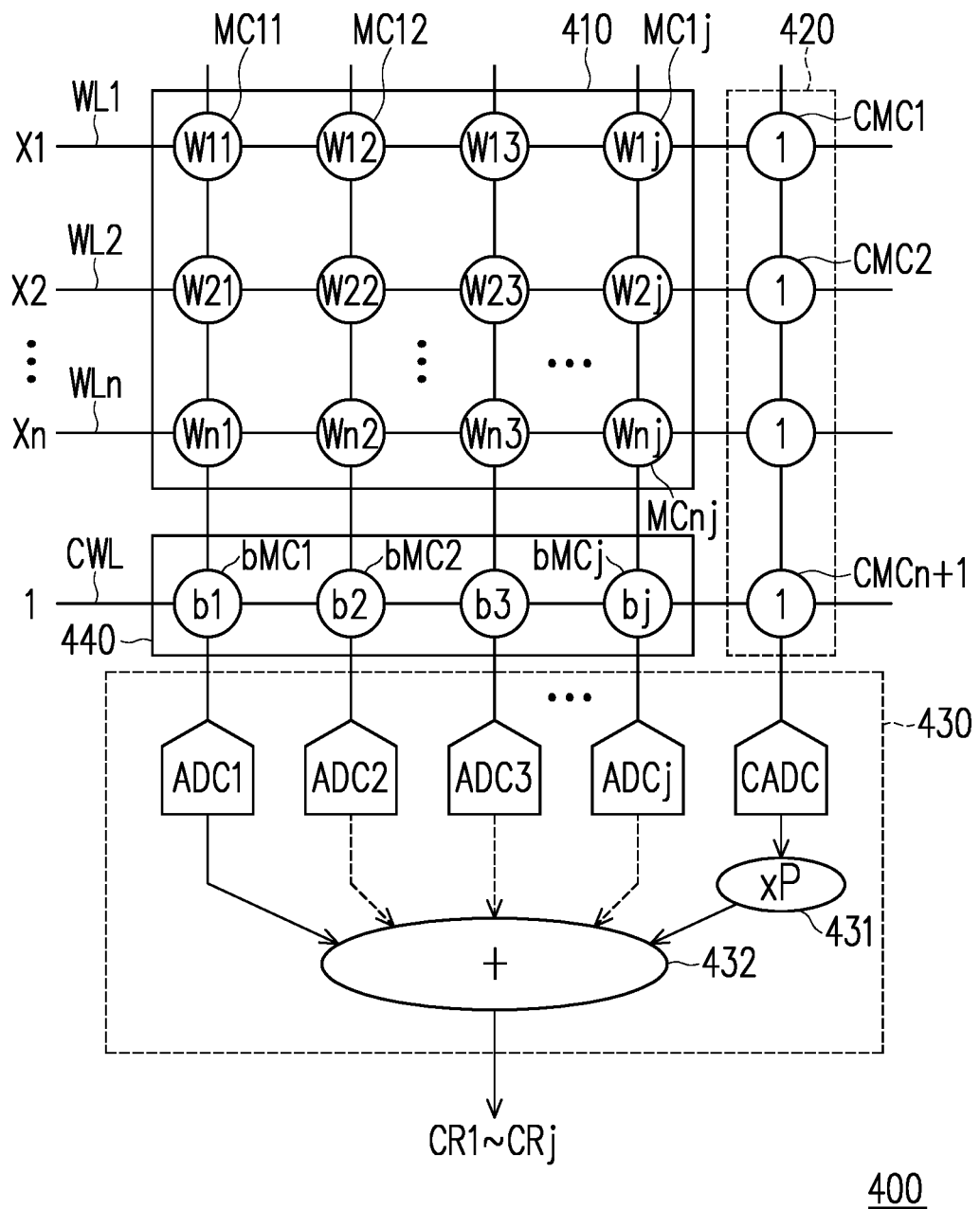

With reference to FIG. 4, FIG. 4 is a schematic view illustrating an in-memory computation device according to another embodiment of the disclosure. An in-memory computation device 400 includes a memory cell array 410, a compensation memory cell string 420, an operator 430, and a bias memory cell array 440. The memory cell array 410 includes a plurality of memory cells MC11-MCnj. Each of the memory cells MC11-MCnj is coupled between the corresponding word line of the word lines WL1-WLn and the corresponding bit line of the bit lines BL1-BLj. The memory cells MC11-MCnj may respectively receive a plurality of input signals X1-Xn through the word lines WL1-WLn. The bias memory cell array 440 includes a bias memory cell string corresponding to the compensation word line CWL. The bias memory cell string has a plurality of bias memory cells bMC1-bMCj coupled to the bit lines BL1-BLj, respectively. The bias memory cells bMC1-bMCj may store a plurality of bias values b1-bj, respectively. The compensation memory cell string 420 includes a plurality of compensation memory cells CMC1-CMCn+1. The compensation memory cells CMC1-CMCn+1 are respectively coupled to the word lines WL1-WLn and the compensation word line CWL. The operator 430 includes a plurality of analog to digital converters ADC1-ADCj and CADC, a multiplier 431, and an adder 432.

Different from the embodiment shown in FIG. 3, this embodiment provides the in-memory computation device 400 which is additionally equipped with a bias memory cell array 440. A plurality of bias memory cells bMC1-bMCj in the bias memory cell array 440 respectively store bias values b1-bj and respectively multiply the bias values b1-bj by a unit signal (e.g., equal to 1) received on the compensation word line CWL. The bias memory cell array 440 provides the multiplication computation result obtained by multiplying the bias values b1-bj by the unit signal to perform a shifting operation on the signals on the bit lines BL1-BLj, respectively.

Figure 5:
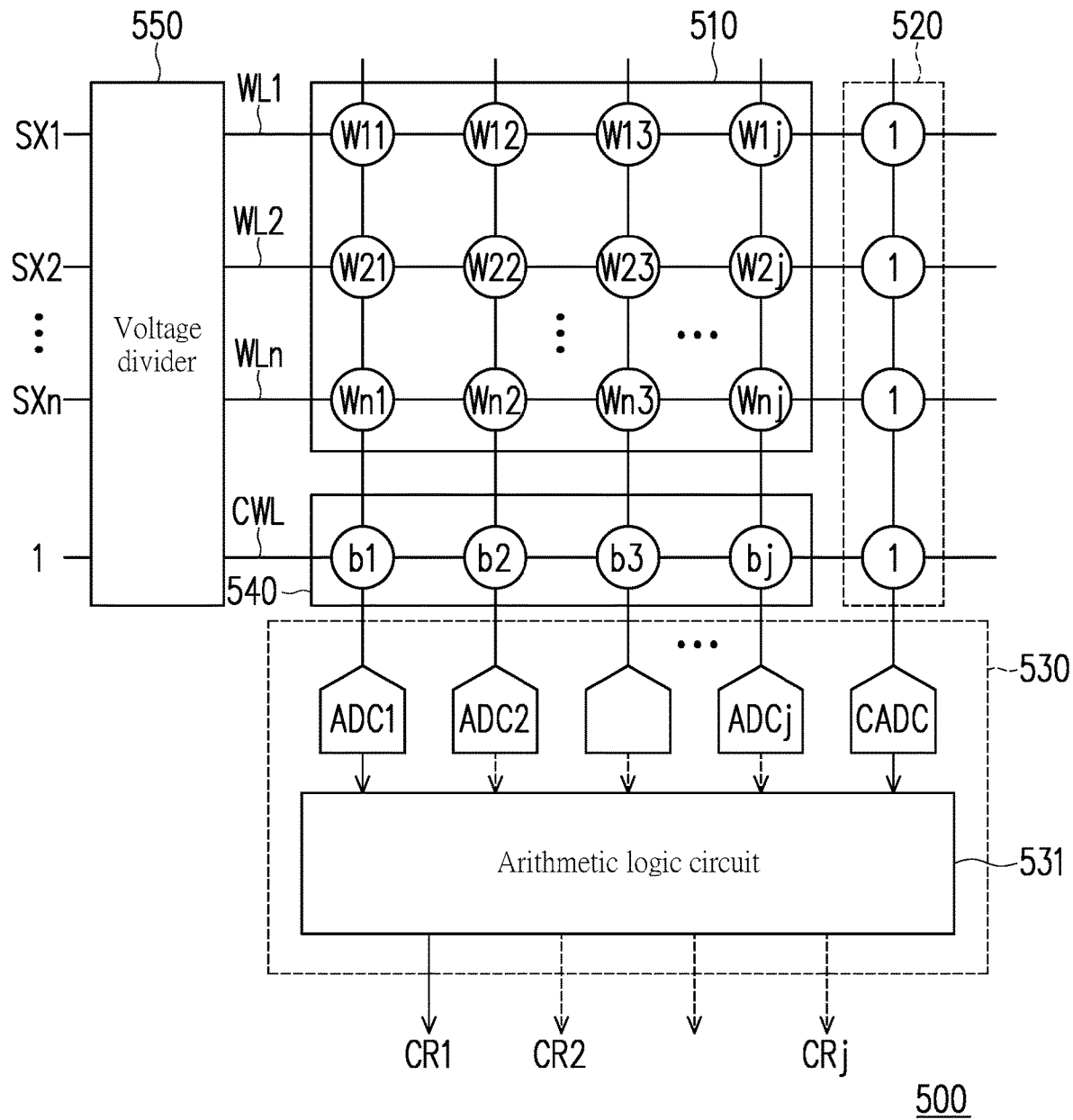

With reference to FIG. 5, FIG. 5 is a schematic view illustrating an in-memory computation device according to another embodiment of the disclosure. An in-memory computation device 500 includes a memory cell array 510, a compensation memory cell string 520, an operator 530, a bias memory cell array 540, and a voltage divider 550. The memory cell array 510, the compensation memory cell string 520, and the bias memory cell array 540 respectively have the same circuit structures as those of the memory cell array 410, the compensation memory cell string 420, and the bias memory cell array 440, and thus no repetitive details are provided hereinafter.

Different from the previous embodiment, this embodiment provides the operator 530 that includes a plurality of analog to digital converters ADC1-ADCj, CADC, and an arithmetic logic circuit 531. The arithmetic logic circuit 531 is coupled to the analog to digital converters ADC1-ADCj and an output end of the analog to digital converter CADC and configured to multiply the output of the analog to digital converter CADC by the peak weight information P to generate the first signal. The arithmetic logic circuit 531 respectively adds the first signal to a plurality of outputs of the analog to digital converters ADC1-ADCj, so as to generate computation results CR1-CRj.

In this embodiment, the arithmetic logic circuit 531 may be a digital circuit with computation capabilities, such as an arithmetic logic unit (ALU).

The voltage divider 550 is coupled to the word lines WL1-WLn and the compensation word line CWL. The voltage divider 550 receives a plurality of source signals SX1-SWn and the unit signal (=1); through a voltage dividing operation, the voltage divider 550 generates a plurality of input signals respectively input to the word lines WL1-WLn according to the source signal SX1-SWn and the unit signal. For instance, the source signals SX1-SWn may be a plurality of digital signals, and the voltage divider 550 may calculate a voltage dividing ratio corresponding to each of the source signals SX1-SWn according to the source signals SX1-SWn and perform a voltage dividing operation on a predetermined voltage value according to the voltage dividing ratio, so as to generate each of the input signals respectively corresponding to the word lines WL1-WLn.

Figure 6A:
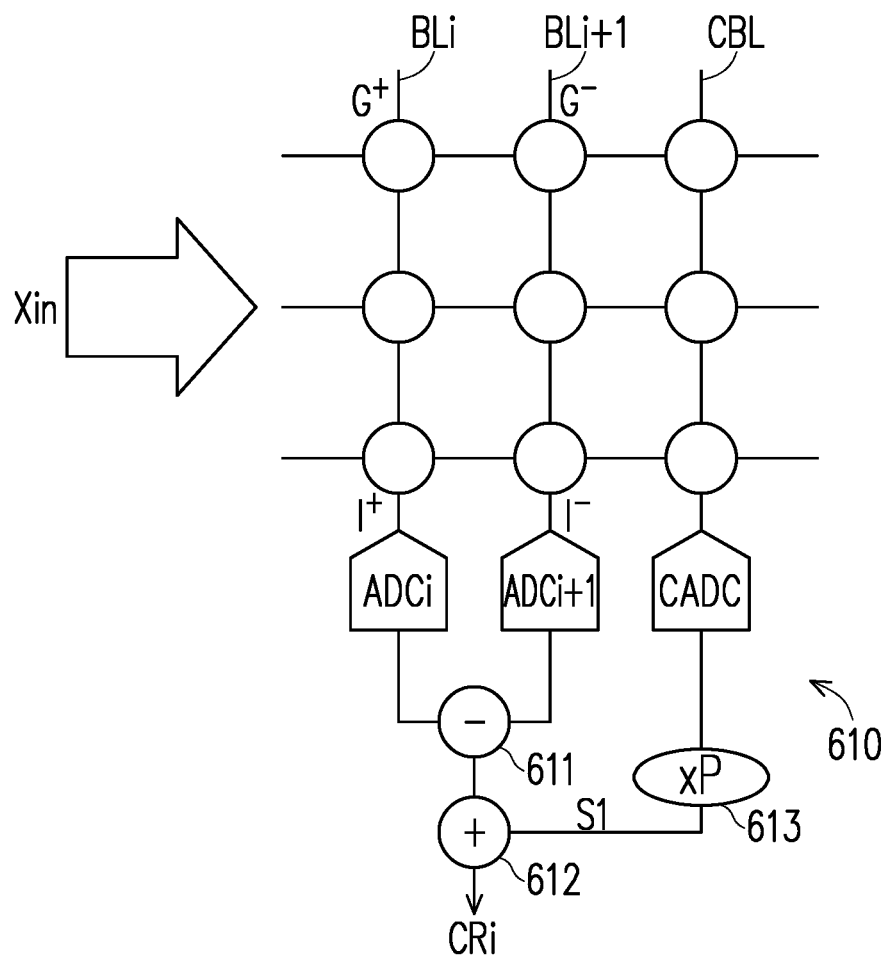
FIG. 6A and FIG. 6B are schematic views respectively illustrating different implementation manner of an operator in an in-memory computation device according to an embodiment of the disclosure.
Figure 6B:
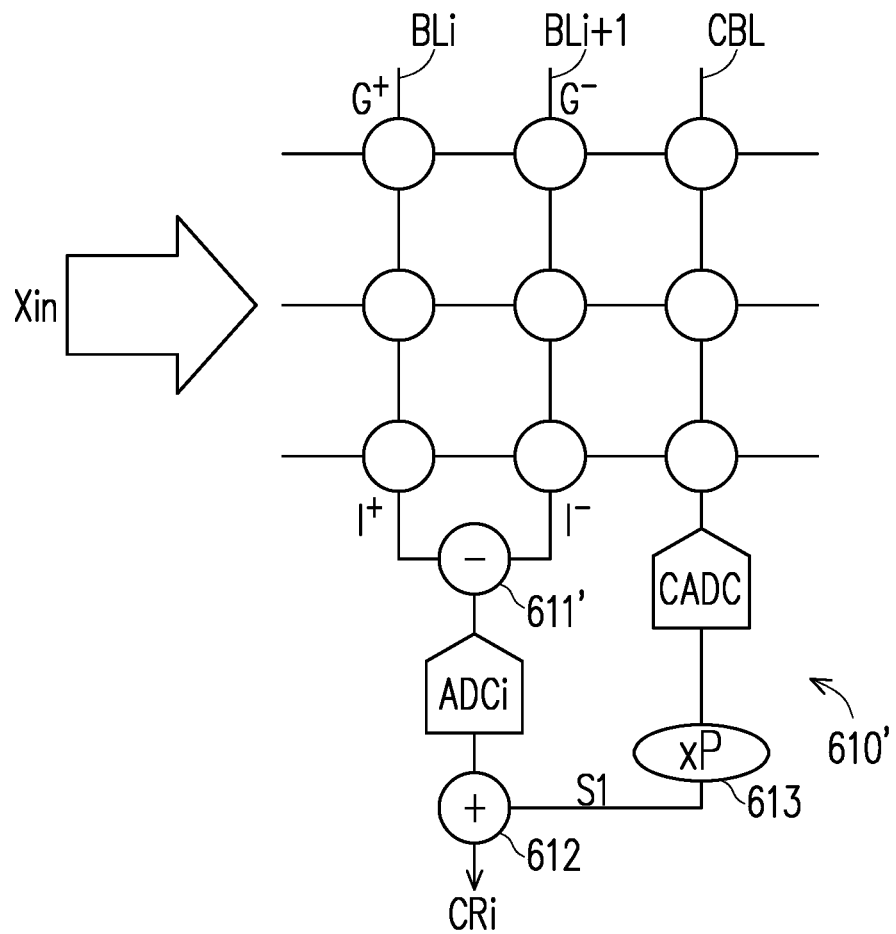

With reference to FIG. 6A and FIG. 6B, FIG. 6A and FIG. 6B are schematic views respectively illustrating different implementation manner of an operator in an in-memory computation device according to an embodiment of the disclosure. In this embodiment, when the memory cells in the memory cell array are the PCM cells, in FIG. 6A, the operator 610 may categorize two adjacent bit lines of the memory cell array into one bit line pair. For instance, two adjacent bit lines BLi and BLi+1 are categorized into one bit line pair. Based on the fact that each pair of memory cells as the PCM cells may provide a weight value, the memory cells on the bit line BLi provides a positive weight value G+, and the memory cells on the bit line BLi+1 provides a negative weight value G−, for instance. In addition, the operator 610 is equipped with analog to digital converters ADCi and ADCj+1 corresponding to the pair of bit lines BLi and BLi+1, respectively. The analog to digital converters ADCi and ADCj+1 are respectively configured to convert signals I+ and I− generated on the bit lines BLi and BLi+1 according to the input signal Xin into digital signals.

The operator 610 may also be equipped with a subtractor 611 and an adder 612 corresponding to the pair of bit lines. The subtractor 611 is configured to subtract the output signals of the analog to digital converters ADCi and ADCi+1 from each other, and the adder 612 is configured to add the outputs of the subtractor 611 to the first signal S1 generated by the multiplier 613, so as to generate the compensation computation result CRi. Here, the multiplier 613 is configured to multiply the signal on the compensation bit line CBL by the peak weight information P and generate the first signal S1.

In FIG. 6B, the operator 610' may also categorize two adjacent bit lines of the memory cell array into a bit line pair and may be equipped with a subtractor 611 corresponding to one bit line pair. In this embodiment, the subtractor 611' is coupled to the bit lines BLi and BLi+1 and subtracts the signals on the bit lines BLi and BLi+1 from each other. The operator 610' is equipped with an analog to digital converter ADCi corresponding to the subtractor 611 for converting the output signal of the subtractor 611' into a digital format. The adder 612 is coupled to an output end of the analog to digital converter ADCi and an output end of the multiplier 613 and is configured to add the output signal of the analog to digital converter ADCi to the first signal S1 generated by the multiplier 613, so as to generate the compensation computation results CRi. The multiplier 613 is configured to multiply the signal on the compensation bit line CBL by the peak weight information P and generate the first signal S1.

Note that the subtractor 611 provided in the previous embodiment may be a digital signal subtractor, and the subtractor 611' may be an analog signal subtractor.

Figure 7:
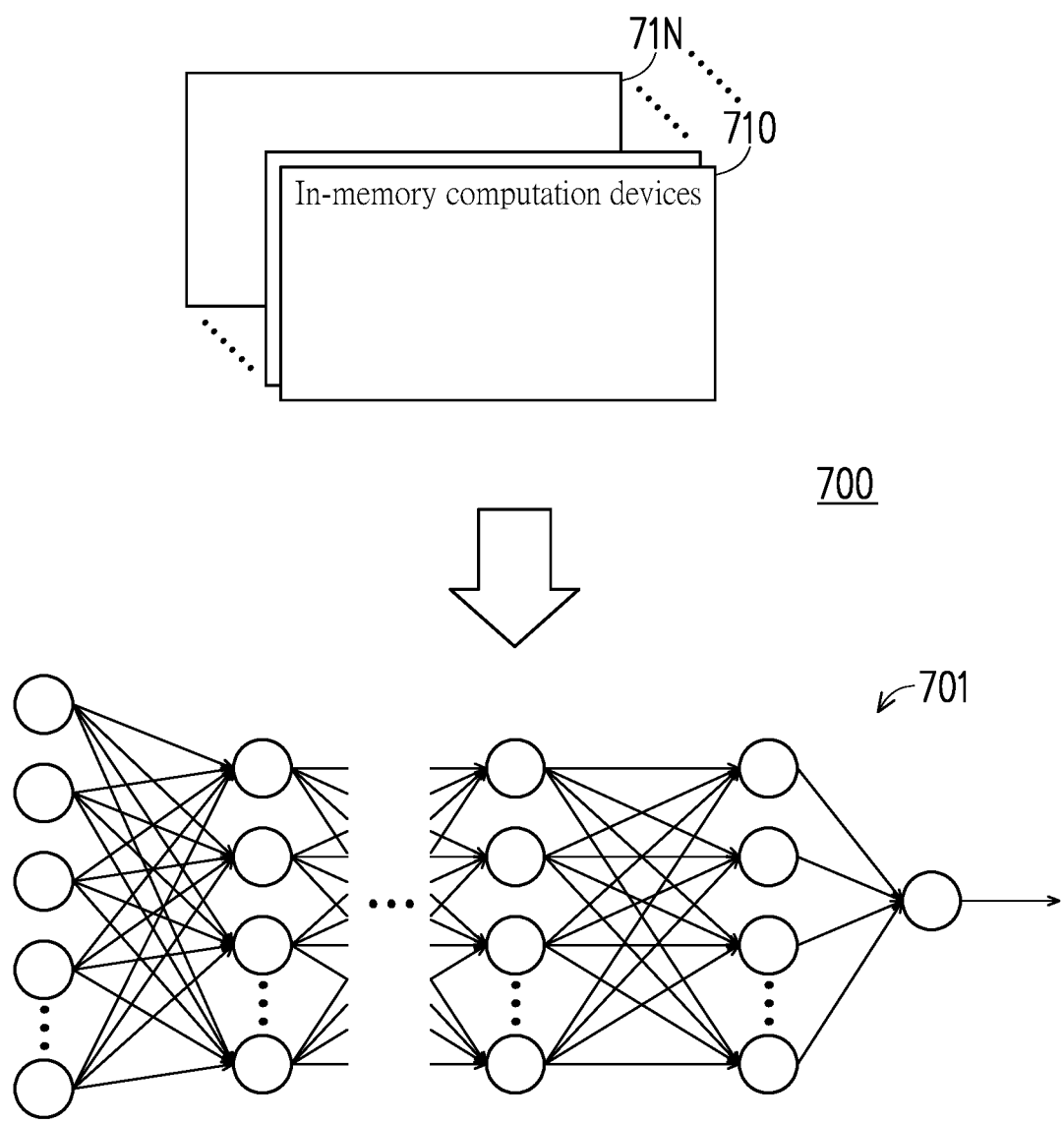
FIG. 7 is a schematic view illustrating an artificial neural network operation circuit according to an embodiment of the disclosure.

With reference to FIG. 7, FIG. 7 is a schematic view illustrating an artificial neural network operation circuit according to an embodiment of the disclosure. An artificial neural network operation circuit 700 includes a plurality of in-memory computation devices 710-71N. The in-memory computation devices 710-71N correspond to a plurality of computational layers of the artificial neural network 701, respectively. Each of the in-memory computation devices 710-71N may be implemented in form of any in-memory computation device provided in one or more embodiments or implementation manner provided above. The implementation manner and the operational details of the in-memory computation devices 710-71N are already elaborated in the previous embodiments and implementation manner, and thus no further description is provided hereinafter.

To sum up, the in-memory computation device provided in one or more embodiments of the disclosure may enable the weight values of the memory cells to be stored in a relatively stable reset state where the peak weight information is 0, and the additional compensation memory cell string may be applied to compensate the computation results, so as to ensure the accuracy of the computation results. As such, the accuracy of the computation results of the in-memory computation device may be effectively improved, and the accuracy of the corresponding artificial neural network computations may be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An in-memory computation device, comprising:
a memory cell array, having a plurality of memory cells to store a plurality of weight values and having a plurality of word lines and a plurality of bit lines;
a compensation memory cell string, having a plurality of compensation memory cells coupled to a compensation bit line, wherein the compensation memory cells are coupled to the word lines, respectively, and each of the compensation memory cells stores a unit weight value; and
an operator, coupled to the bit lines and the compensation bit line, multiplying a signal on the compensation bit line by peak weight information of the weight values to generate a first signal, and adding the first signal to a signal on each of the bit lines to obtain a plurality of computation results, respectively.

2. The in-memory computation device according to claim 1, wherein the word lines respectively receive a plurality of input signals.

3. The in-memory computation device according to claim 1, further comprising:
a bias memory cell array, comprising a bias memory cell string corresponding to a compensation word line, wherein the bias memory cell string has a plurality of bias memory cells respectively coupled to the bit lines, and the bias memory cells respectively store a plurality of bias values.

4. The in-memory computation device according to claim 1, wherein the operator comprises:
a plurality of analog to digital converters, converting the signals on the bit lines and the signal on the compensation bit line to a digital format; and
an arithmetic logic circuit, multiplying the signal in the digital format on the compensation bit line by the peak weight information of the weight values to generate the first signal and adding the signal in the digital format on each of the bit lines to the first signal to generate the computation results, respectively.

5. The in-memory computation device according to claim 1, wherein the operator comprises:
a plurality of analog to digital converters, converting the signals on the bit lines and the signal on the compensation bit line into a digital format;
a multiplier, multiplying the signal in the digital format on the compensation bit line by the peak weight information of the weight values to generate the first signal; and
an adder, adding the signal in the digital format on each of the bit lines to the first signal to generate the computation results, respectively.

6. The in-memory computation device according to claim 1, further comprising:
a voltage dividing circuit, coupled to the word lines, receiving a plurality of source signals, and generating a plurality of input signals through performing a voltage dividing operation according to the source signals.

7. The in-memory computation device according to claim 1, wherein the peak weight information of the weight values is a weight value of the weight values corresponding to a maximum quantity of the memory cells.

8. The in-memory computation device according to claim 1, wherein each of the weight values is a conductance value or a resistance value.

9. The in-memory computation device according to claim 1, wherein the signal on the compensation bit line is a voltage signal or a current signal, and the signals on the bit lines are voltage signals or current signals.

10. The in-memory computation device according to claim 1, wherein the operator categorizes the bit lines as a plurality of bit line pairs, subtracts signals on two adjacent bit lines in each of the bit line pairs from each other to generate a plurality of second signals, and adds each of the second signals to the first signal to generate the computation results, respectively.

11. The in-memory computation device according to claim 10, wherein the operator comprises:
a multiplier, multiplying the signal on the compensation bit line by the peak weight information of the weight values to generate the first signal;

a plurality of subtractors, wherein each of the subtractors is disposed between the adjacent bit lines of each of the bit line pairs to generate the second signals, respectively; and an adder, adding the first signal to the respective second signals to generate the computation results, respectively.

12. The in-memory computation device according to claim 11, wherein the operator further comprises:

a plurality of analog to digital converters, coupled to the bit lines and the compensation bit line and configured to convert the signals on the bit lines and the signal on the compensation bit line to a digital format.

13. The in-memory computation device according to claim 11, wherein the operator further comprises:

a plurality of analog to digital converters, coupled to the subtractors and the compensation bit line and configured to convert the second signals and the signal on the compensation bit line to a digital format.

14. The in-memory computation device according to claim 1, where each of the weight values is stored in each of the memory cells, or each of the weight values is split into a plurality of partial weight values and respectively stored in a plurality of the memory cells.

15. The in-memory computation device according to claim 1, wherein the memory cells are phase change memory cells, resistive memory cells, ferroelectric memory cells, ferroelectric field effect transistor memory cells, magnetoresistive memory cells, or flash memory cells.

16. An artificial neural network operation circuit, comprising:

a plurality of in-memory computation devices, each of the in-memory computation devices comprising:

a memory cell array, having a plurality of memory cells to respectively store a plurality of weight values and having a plurality of word lines and a plurality of bit lines;

a compensation memory cell string, having a plurality of compensation memory cells coupled to a compensation bit line, wherein the compensation memory cells are coupled to the word lines, respectively, and each of the compensation memory cells stores a unit weight value; and an operator, coupled to the bit lines and the compensation bit line, multiplying a signal on the compensation bit line by peak weight information of the weight values to generate a first signal, and adding the first signal to a signal on each of the bit lines to obtain a plurality of computation results, respectively.

17. The artificial neural network operation circuit according to claim 16, wherein the in-memory computation devices respectively correspond to a plurality of computational layers of an artificial neural network.

18. The artificial neural network operation circuit according to claim 16, wherein each of the in-memory computation devices further comprises:

a bias memory cell array, comprising a bias memory cell string corresponding to a compensation word line, wherein the bias memory cell string has a plurality of bias memory cells coupled to the bit lines, respectively, and the bias memory cells respectively store a plurality of bias values.

19. The artificial neural network operation circuit according to claim 16, wherein the signal on the compensation bit line is a voltage signal or a current signal, and the signals on the bit lines are voltage signals or current signals.

20. The artificial neural network operation circuit according to claim 16, wherein the memory cells are phase change memory cells, resistive memory cells, ferroelectric memory cells, ferroelectric field effect transistor memory cells, magnetoresistive memory cells, or flash memory cells.

* * * * *